United States Patent
Lee

(10) Patent No.: US 6,774,424 B2
(45) Date of Patent: Aug. 10, 2004

(54) SYNCHRONOUS DYNAMIC RANDOM ACCESS MEMORY (SDRAM) STRUCTURE

(75) Inventor: Chin Lee, Hsin-Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/369,077

(22) Filed: Feb. 13, 2003

(65) Prior Publication Data

US 2004/0012045 A1 Jan. 22, 2004

(30) Foreign Application Priority Data

Jul. 22, 2002 (TW) ........................................ 91116233 A

(51) Int. Cl.⁷ .............................................. H01L 29/76
(52) U.S. Cl. ........................ 257/304; 257/301; 257/302; 257/303
(58) Field of Search ................................ 257/301–306, 257/262; 438/245–249, 542

(56) References Cited

U.S. PATENT DOCUMENTS 6,521,938 B2 * 2/2003 Hamamoto .................. 257/304

* cited by examiner

Primary Examiner—Dung A. Le
(74) Attorney, Agent, or Firm—J.C. Patents

(57) ABSTRACT

A synchronous dynamic random access memory (SDRAM) structure is provided. A stacked capacitor structure and a trench capacitor structure are integrated together within each memory cell such that the two capacitors overlap over each other to reduce overall area occupation of the SDRAM array.

12 Claims, 16 Drawing Sheets

SYNCHRONOUS DYNAMIC RANDOM ACCESS MEMORY (SDRAM) STRUCTURE

CROSS-REFERENCE TO RELATED APPLICATION

This application claims the priority benefit of Taiwan application serial no.91116233, filed on Jul. 22, 2002.

BACKGROUND OF THE INVENTION

1. Field of Invention

The present invention relates to a synchronous dynamic random access memory (SDRAM) structure and a method of fabricating the same. More particularly, the present invention relates to a SDRAM structure having a deep-trench capacitor and a stacked capacitor.

2. Description of Related Art

Memory is a semiconductor storage device for holding programs or data. In general, the number of bits a memory device can store determines the capacity of the device and each memory cell is a basic unit for holding a single bit of data. The memory cells are usually arranged into an array such that each column of memory cells is serially linked together by a single bit line (BL) while each row of memory cells is serially linked together by a single word line (WL). Through a bit line and a word line connection, the location or the address of a particular memory cell is easily pinpointed. In addition, each memory may further include an address decoder for decoding memory addresses and some other peripheral circuits to facilitate memory operation.

In general, the larger the number of memory cells in a memory array, the larger will be the capacity of the memory device. Hence, increasing the number of memory cells per unit surface area of the wafer is a perpetual target for memory device development.

FIG. 1 is a schematic sectional view of a conventional synchronous dynamic random access memory with a stacked capacitor. As shown in FIG. 1, a transistor is formed over a substrate 100. The transistor is a three-terminal device including a gate terminal 102 and a pair of source/drain terminals 106. The gate 102 is formed over the substrate 100. A gate insulation layer 104 separates the gate 102 from the substrate 100. The source/drain terminals 106 are doped regions in the substrate 100 on each side of the gate 102. One source/drain terminal 106 is electrically connected to a stack capacitor structure 108. Another source/drain terminal 106 is electrically connected to a bit line 110. A conventional stack capacitor 108 has a three-layered structure that includes a conductive layer, a dielectric layer and another conductive layer. The entire stack capacitor structure 108 is formed over the substrate 100.

FIG. 2 is a schematic cross-sectional view of a conventional synchronous dynamic random access memory with a trench capacitor. As shown in FIG. 2, a transistor is formed over a substrate 200. The transistor is a three-terminal device including a gate terminal 202 and a pair of source/drain terminals 206. The gate 202 is formed over the substrate 200. A gate insulation layer 204 separates the gate 202 from the substrate 200. The source/drain terminals 206 are doped regions in the substrate 200 on each side of the gate 202. One source/drain terminal 206 is electrically connected to a trench capacitor structure 208. Another source/drain terminal 206 is electrically connected to a bit line 210. A conventional trench capacitor 208 has a three-layered structure that includes a conductive layer, a dielectric layer and another conductive layer. The entire trench capacitor structure 208 is embedded inside the substrate 200.

FIG. 3 is a circuit diagram showing the memory cell design of a conventional synchronous dynamic random access memory. FIG. 4 is the circuit diagram of a conventional sense amplifier. Using the sense amplifier in FIG. 4 to extract data from the capacitor involves the following steps. First, voltage equalizing transistor EQL equalizes the voltage at the bit line BL and /BL and then sets their voltage to a pre-defined voltage level VEQ. Thereafter, the transistor EQL is shut off and then the word line WL0 transmits a read signal to the control transistor N linked to the capacitor C. The capacitor C charges up the word line /BL (if the capacitor C stores positive charges) so that voltage level of the bit line /BL reaches VEQ+ΔV. At this moment, voltage level of the bit line BL is still maintained at VEQ. After charging up the bit line /BL, the gate of both the P-type transistor P1 and the N-type transistor N1 are at a voltage level VEQ+ΔV and the gate of both the P-type transistor P2 and the N-type transistor N2 are at a voltage level VEQ. The bias voltage applied to the transistors N2 and P2 is VEQ and the bias voltage applied to the transistor N1 and P1 is VEQ+ΔV. This will lead to the gradual shutdown of the low VT transistors N2 and P1 through the slow opening of the low VT transistors N1 and P2 due to the external voltage VDD and VSS. This process is continued until the transistors N1 and P2 are completely open and the transistors N2 and P1 are completely close. Thereafter, a voltage from a column decoder is transmitted to the gate terminal of the N-type transistors N3 and N4. The voltage source VSS will output a voltage level to a data line (Data) via the transistor N1 and the voltage source VDD will output a voltage level to a data line (/Data) via the transistor P2. Through the signals on the data lines (Data and /Data), the data value (a data value of '1' or '0') stored inside the capacitor C can be determined.

According to FIG. 3, when the sense amplifier X attempts to read out memory cell data, the reading operation may lead to a drop or a rise in the voltage of the memory cell in excess of or in short of the base voltage necessary to determine the next '0' or '1' data value. However, as BL and /BL are pulled towards VDD and VSS, the memory cell is undergoing a data refresh operation to ensure a normal operation the next time. Using memory read from the memory cell A as an example, the word line WL0 will remain in an open state during the read operation and the sense amplifier X will select bit line BL1 and read out the data inside the memory cell A. Furthermore, after the read-out operation, the sense amplifier X will perform a data refresh operation of the memory cell again.

If the dash-line circled section underneath the memory cell A in FIG. 3 has another memory cell B, the word line WL0 will open up both memory cell A and memory cell B in the process of reading data from memory cell A. Due to some limitations of the sense amplifier X circuit (as shown in FIG. 3), there are two major problems. Firstly, the opened memory cell A and memory cell B prevents the executing of the refresh operation. Secondly, signals from memory cell A and memory B may divert to BL1 and /BL1, when the word line WL0 switches open the memory cell A and the memory cell B at the same time. If the signals to the bit lines BL1 and /BL1 flows in the same direction (that is, both are at logic level '0' or '1'), the sense amplifier is prevented from operation. On the contrary, if the signals to the bit lines BL1 and /BL1 flows in opposite direction (one at logic level '0' and the other at logic level '1'), the user cannot decide whether the signal comes from memory cell A or the memory cell B. In other words, if a memory cell is located within the dash-line circle, repeated selection of bit line may lead to a failure to refresh some portion of the memory cell or the production of read-out errors.

As shown in FIG. 3, the sense amplifier X is designed with the concept that both bit line BL and bit line /BL lie along the same X-coordinate, no matter if the SDRAM has stack capacitor or a trench capacitor. Moreover, each sense amplifier X is capable of controlling bit lines BL0, /BL0, BL1 and /BL1. In addition, because of circuit limitation of the sense amplifier X and consideration regarding wafer fabrication, useful memory cells are located inside the solid circle portion only. That means, in designing the layout of an integrated circuit, the dash-line circle portion in FIG. 3 must be free of any memory cell. Since some areas must be vacated in this type of circuit layout design, wafer areas are wasted.

SUMMARY OF THE INVENTION

Accordingly, one object of the present invention is to provide a synchronous dynamic random access memory (SDRAM) structure and a method of fabricating the same. The SDRAM structure is capable of increasing memory capacity per unit wafer area.

A second object of this invention is to provide a synchronous dynamic random access memory (SDRAM) structure and a method of fabricating the same such that capacitance in each unit memory cell within the SDRAM is increased.

To achieve these and other advantages and in accordance with the purpose of the invention, as embodied and broadly described herein, the invention provides a SDRAM structure. The structure has a trench capacitor and a stack capacitor overlapping each other. An epitaxial layer is formed over a substrate. Detached upper and lower source regions are formed in the substrate and the epitaxial layer respectively for connecting with the upper stack capacitor structure and the lower trench capacitor structure. Hence, this invention is able to increase memory capacity per unit wafer area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 2:
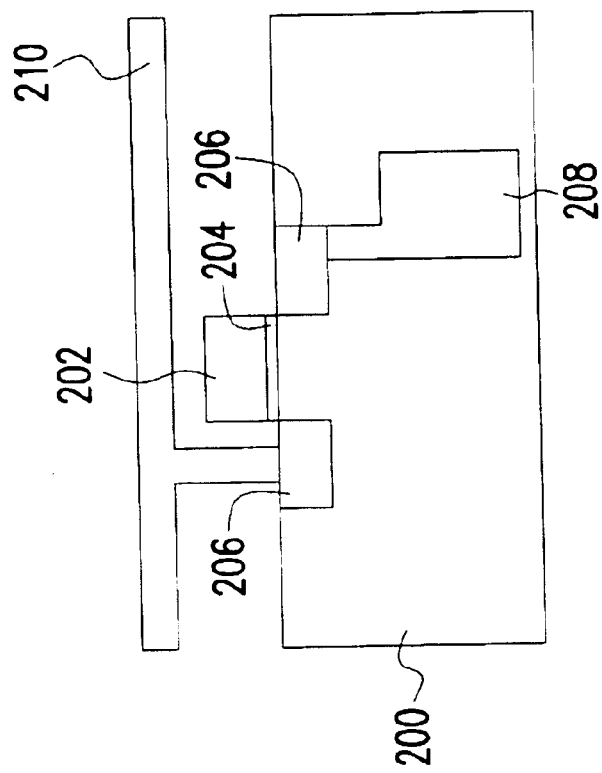
FIG. 2 shows a schematic cross-sectional view of a conventional synchronous dynamic random access memory with a trench capacitor.
Figure 1:
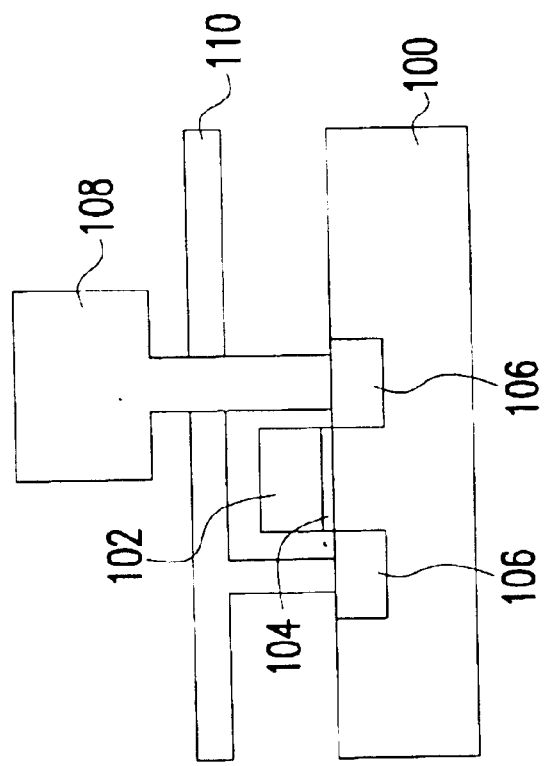
FIG. 1 shows a schematic sectional view of a conventional synchronous dynamic random access memory with a stacked capacitor.

Reference will now be made in detail to the present preferred embodiments of the invention, examples of which are illustrated in the accompanying drawings. Wherever possible, the same reference numbers are used in the drawings and the description to refer to the same or like parts.

Figure 5:
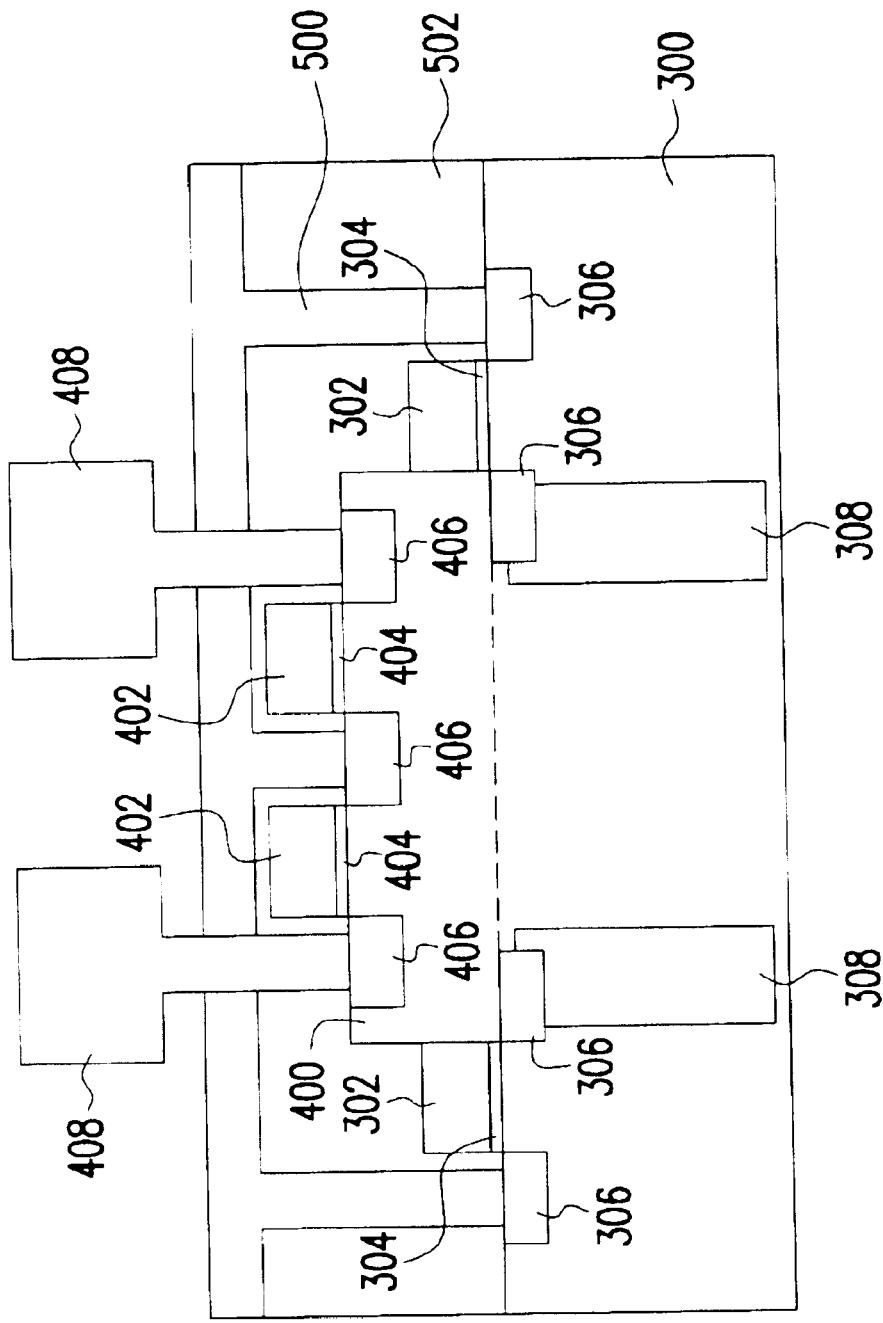
FIG. 5 shows a schematic cross-sectional view of a synchronous dynamic random access memory structure according to one preferred embodiment of this invention.

FIG. 5 is a schematic cross-sectional view of a synchronous dynamic random access memory structure according to one preferred embodiment of this invention. As shown in FIG. 5, the synchronous dynamic random access memory is built on a substrate 300. The substrate 300 is a silicon substrate, for example. A plurality of first transistors is positioned over the substrate 300. Each first transistor comprises of a gate 302, a gate insulation layer 304 and a pair of source/drain terminals 306. The source/drain terminals 306 of the first transistor are electrically connected to a trench capacitor structure 308 and a bit line 500 respectively. The source/drain terminals 306 are N-doped regions, for example.

In addition, an epitaxial layer 400 is positioned over the substrate 300. The epitaxial layer 400 is a silicon epitaxial layer, for example. A plurality of second transistors is formed over the epitaxial layer 400. Each second transistor comprises of a gate 402, a gate insulation layer 404 and a pair of source/drain terminals 406. The source/drain terminals 406 of the second transistor are electrically connected to a stacked capacitor structure 408 and the bit line 500 respectively. The source/drain terminals 406 are N-doped regions, for example.

Since the epitaxial layer 400 is above the substrate 300, two detached source/drain terminals 306 and 406 can be fabricated in the substrate 300 and the epitaxial layer 400 to be used by the trench capacitor structure 308 below and stacked capacitor structure 408 above. Furthermore, the source/drain terminals 306, 406 overlap so that some wafer area is saved and the number of memory cells per unit area is increased.

Figure 8A:
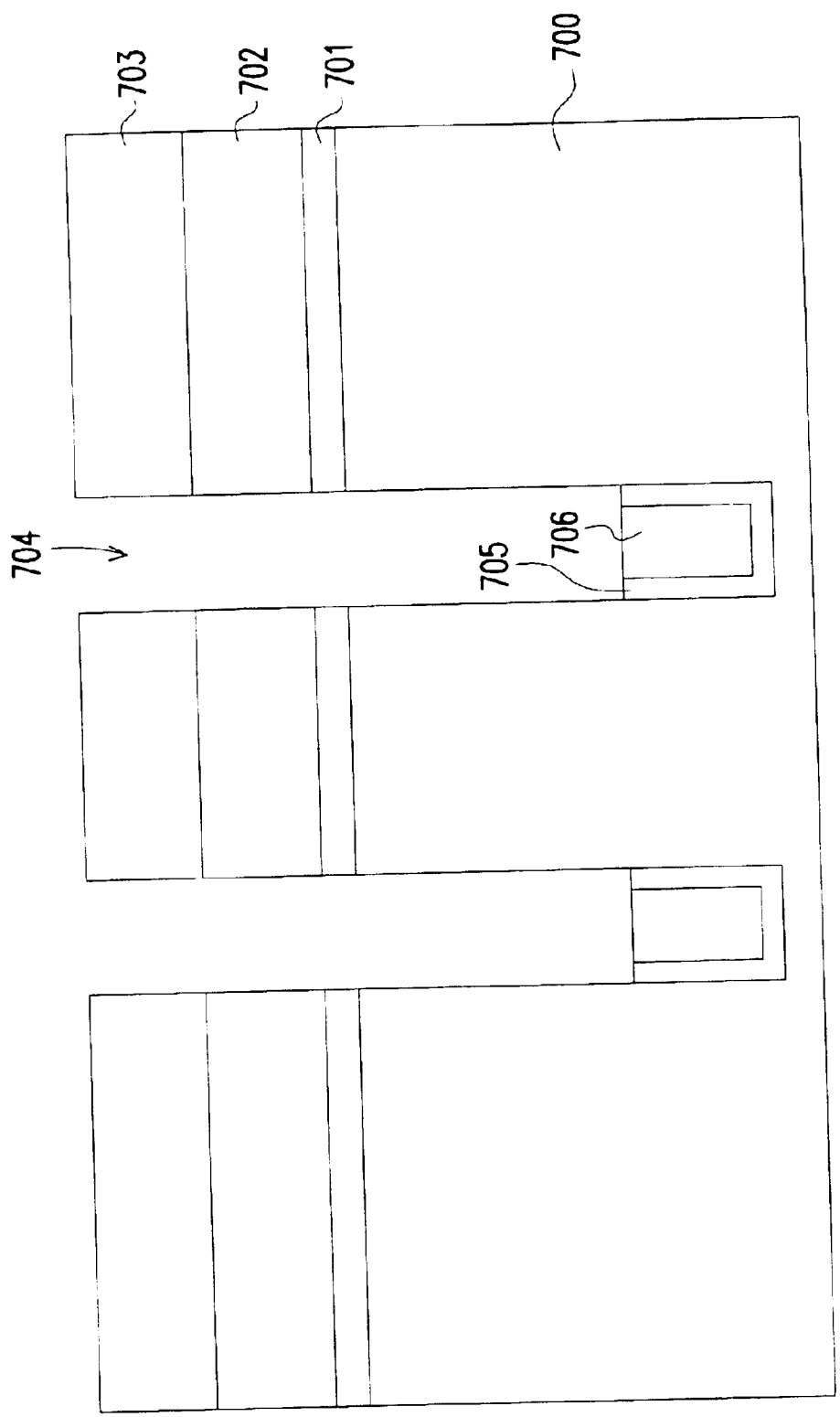
FIGS. 8A to 8J show schematic cross-sectional views showing the progression of steps for fabricating a synchronous dynamic random access memory according to another preferred embodiment of this invention.
Figure 8B:
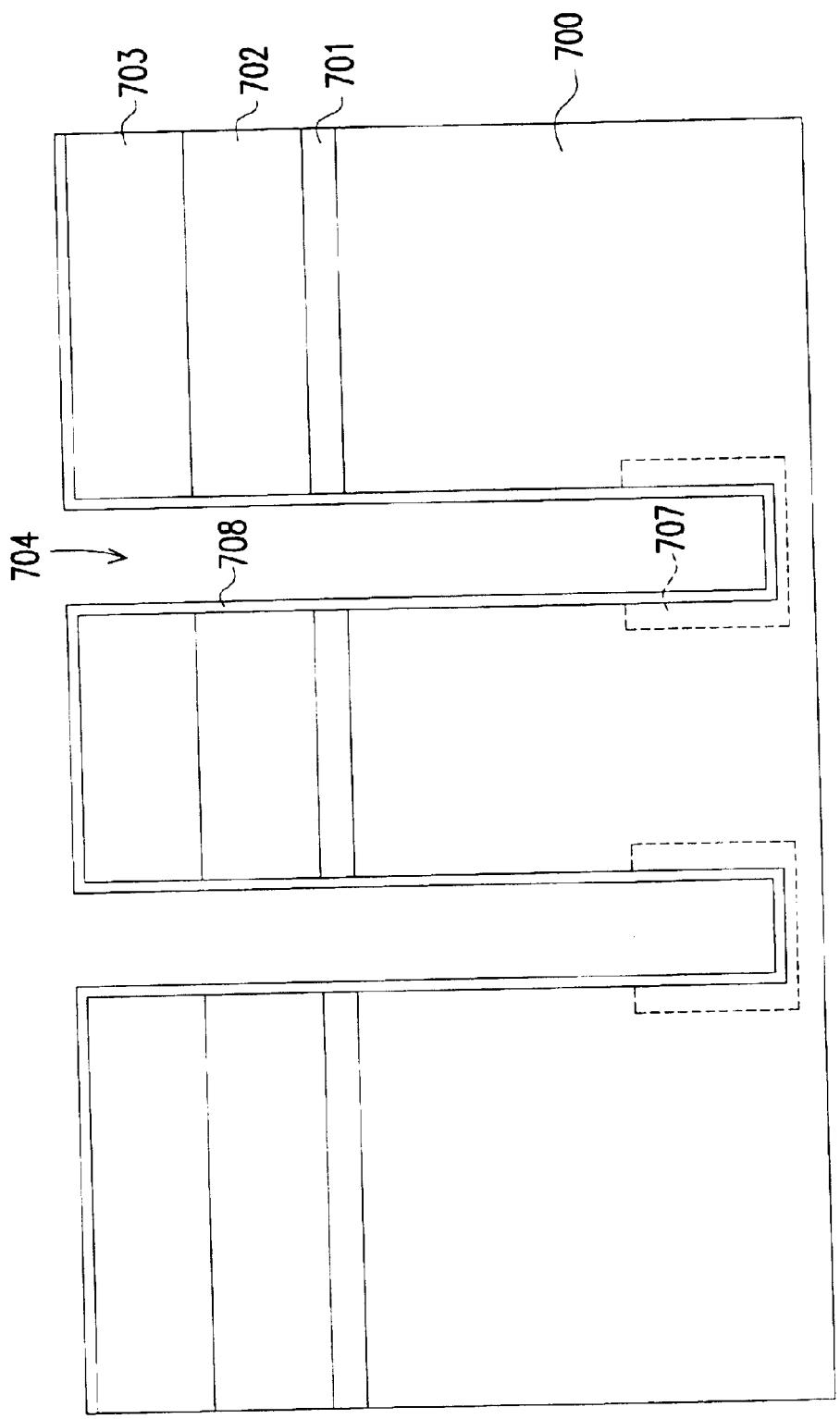
Figure 8C:
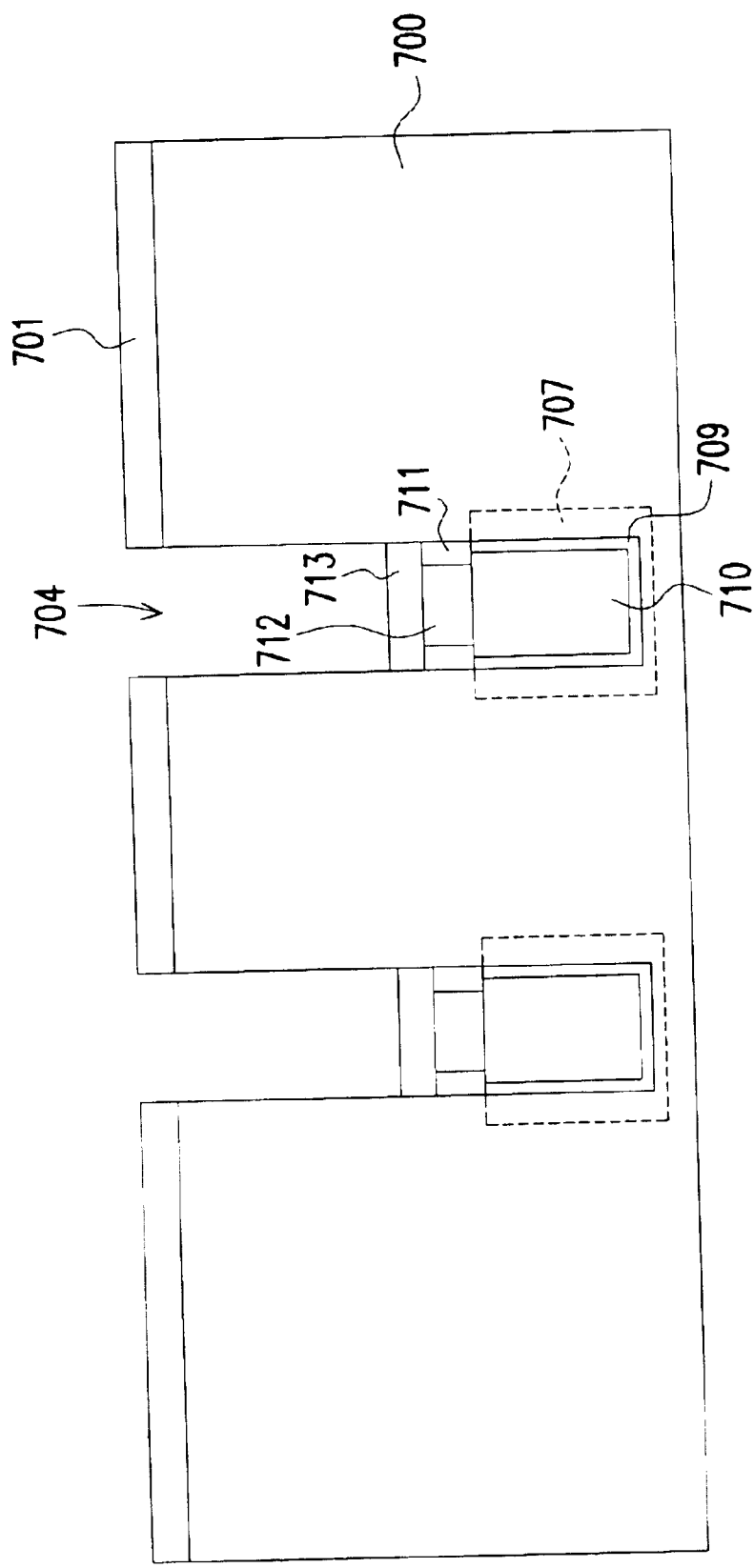
Figure 8D:
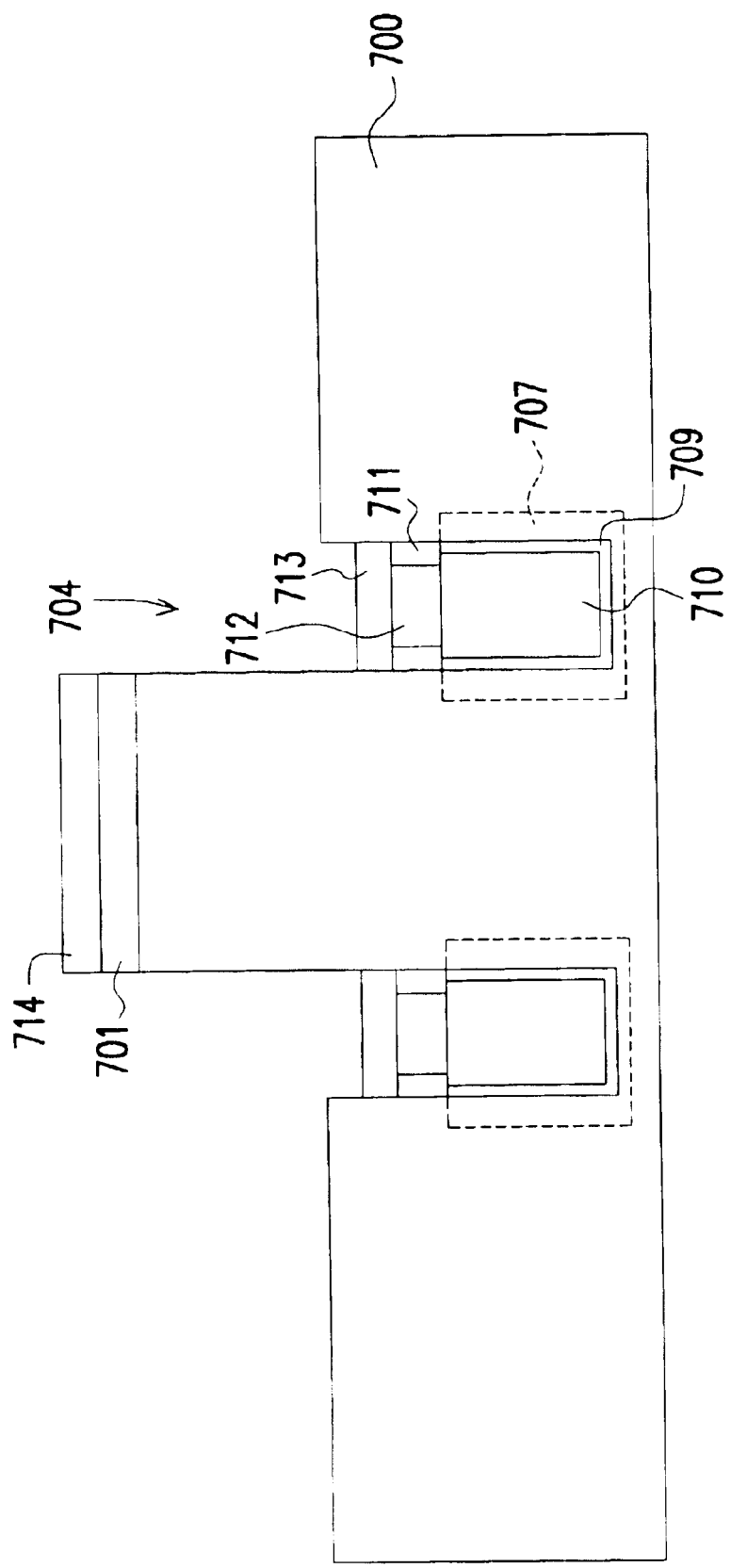
Figure 8E:
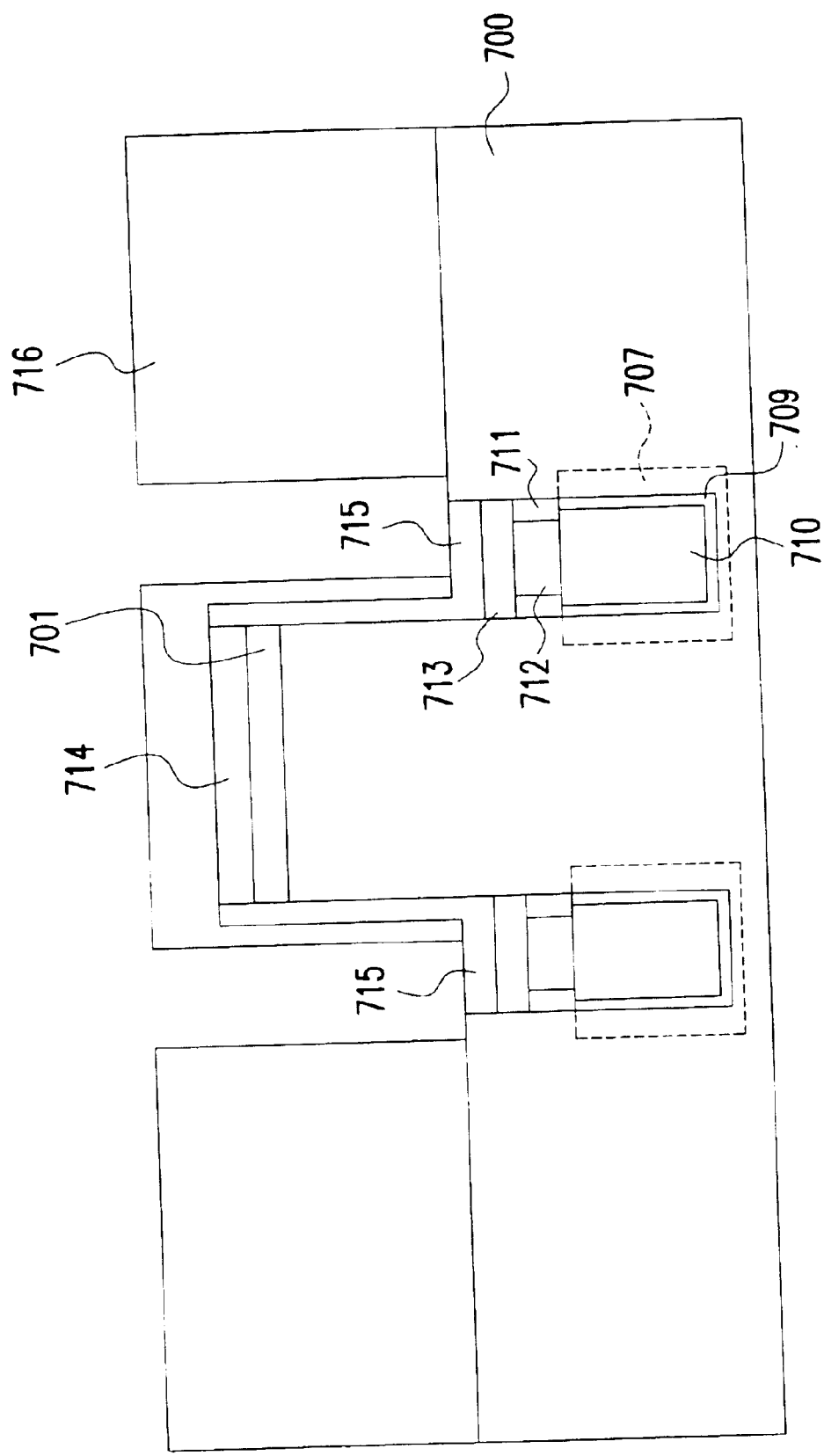
Figure 8F:
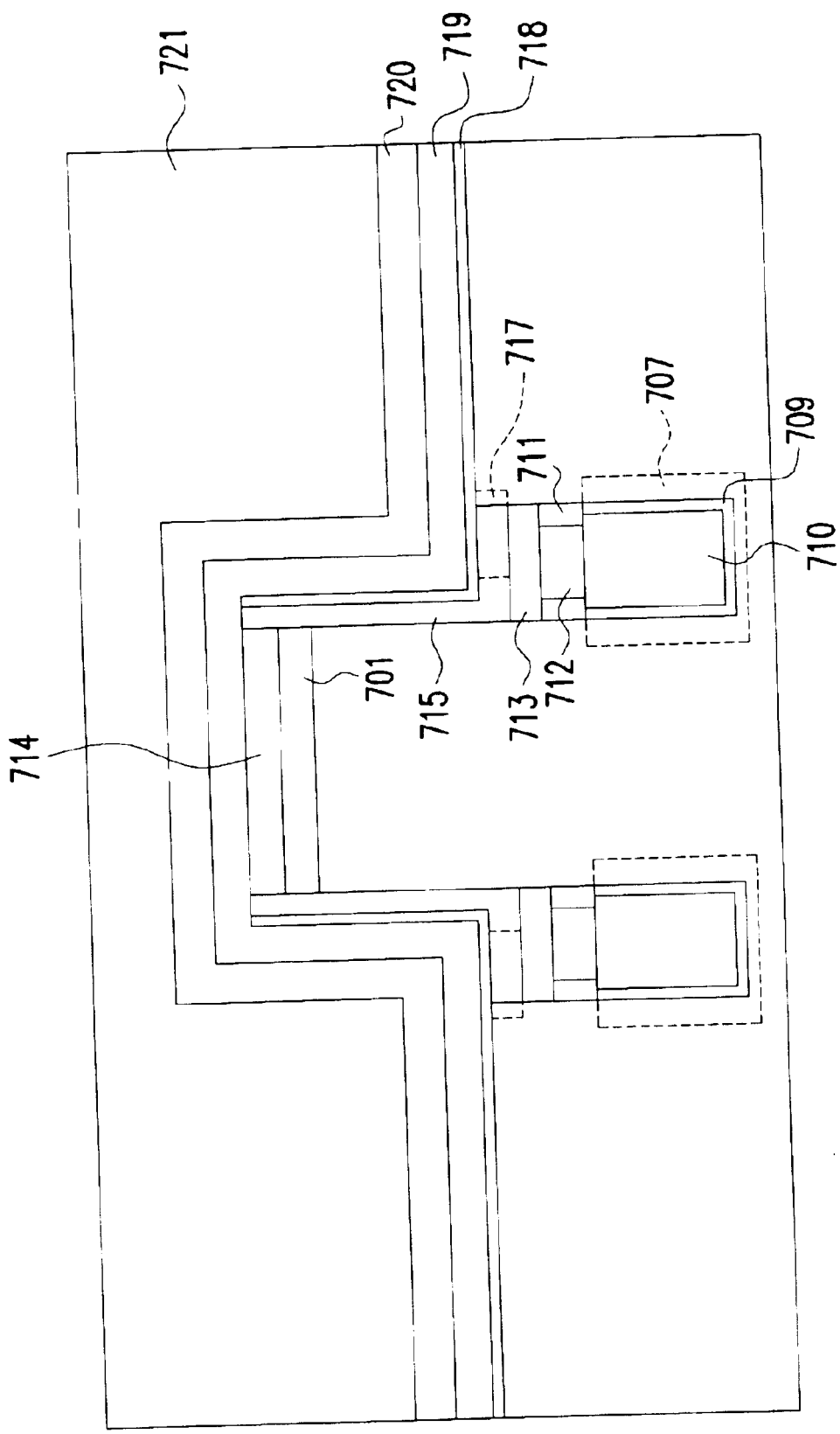
Figure 8G:
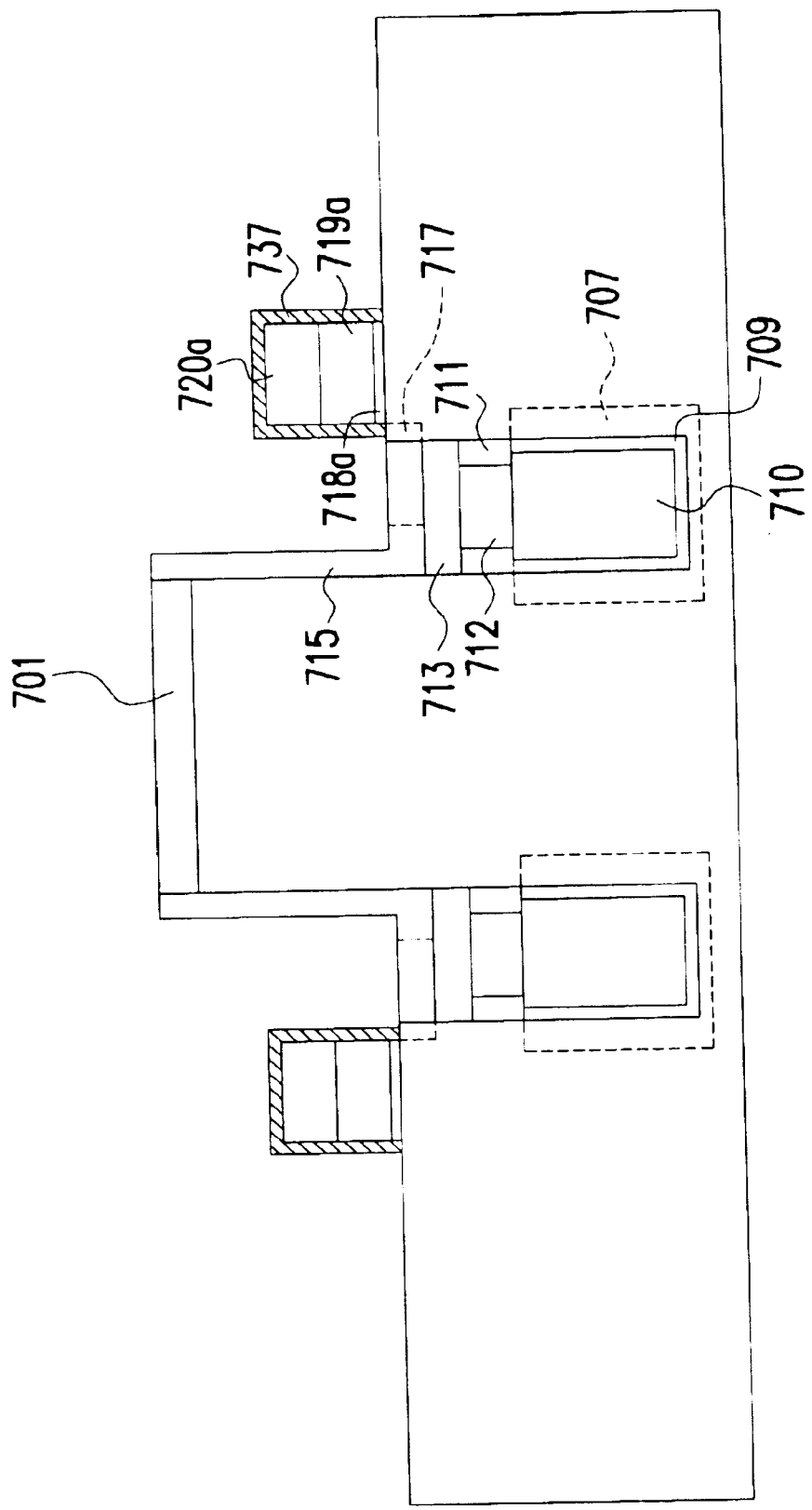
Figure 8H:
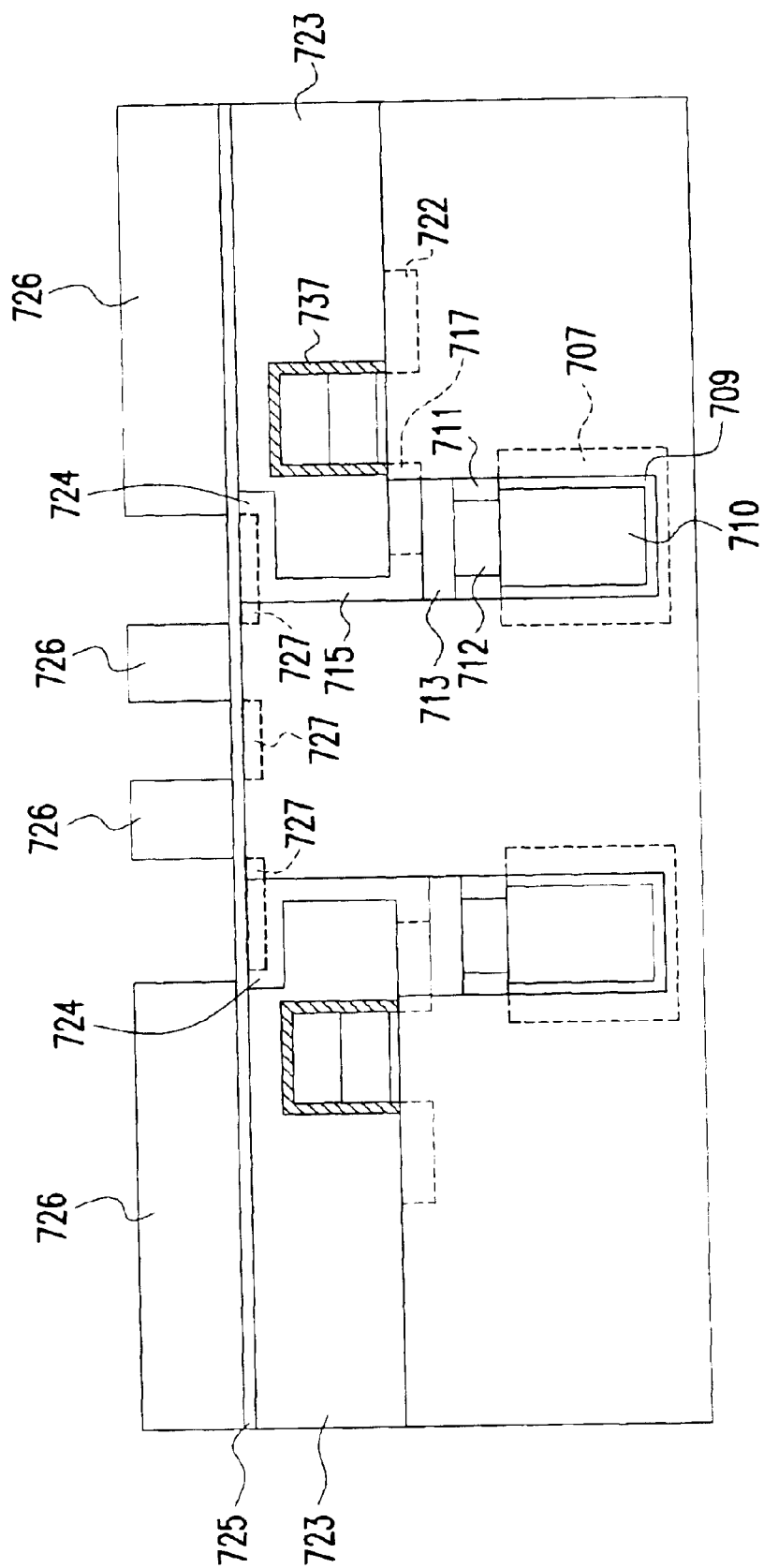
Figure 8I:
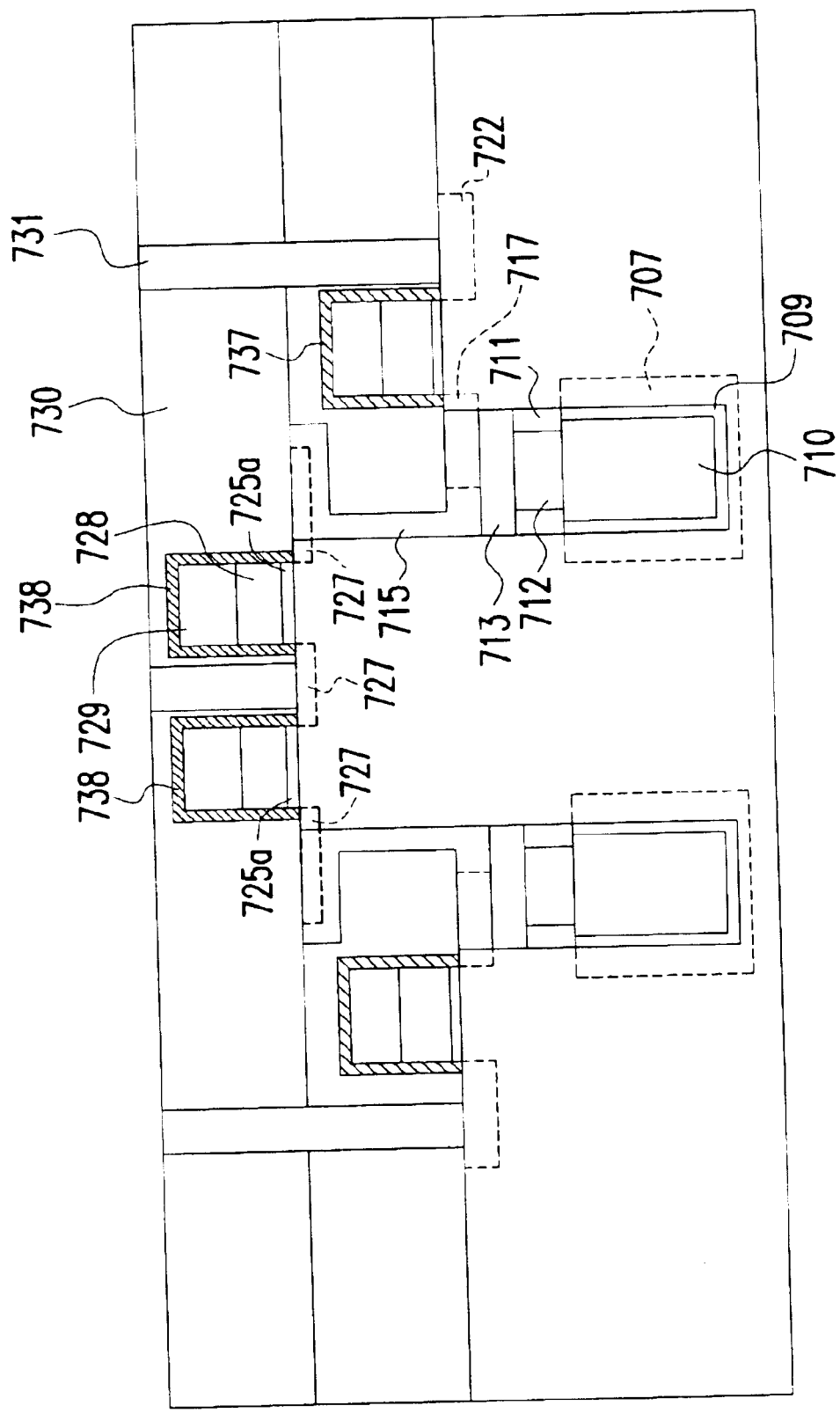
Figure 8J:
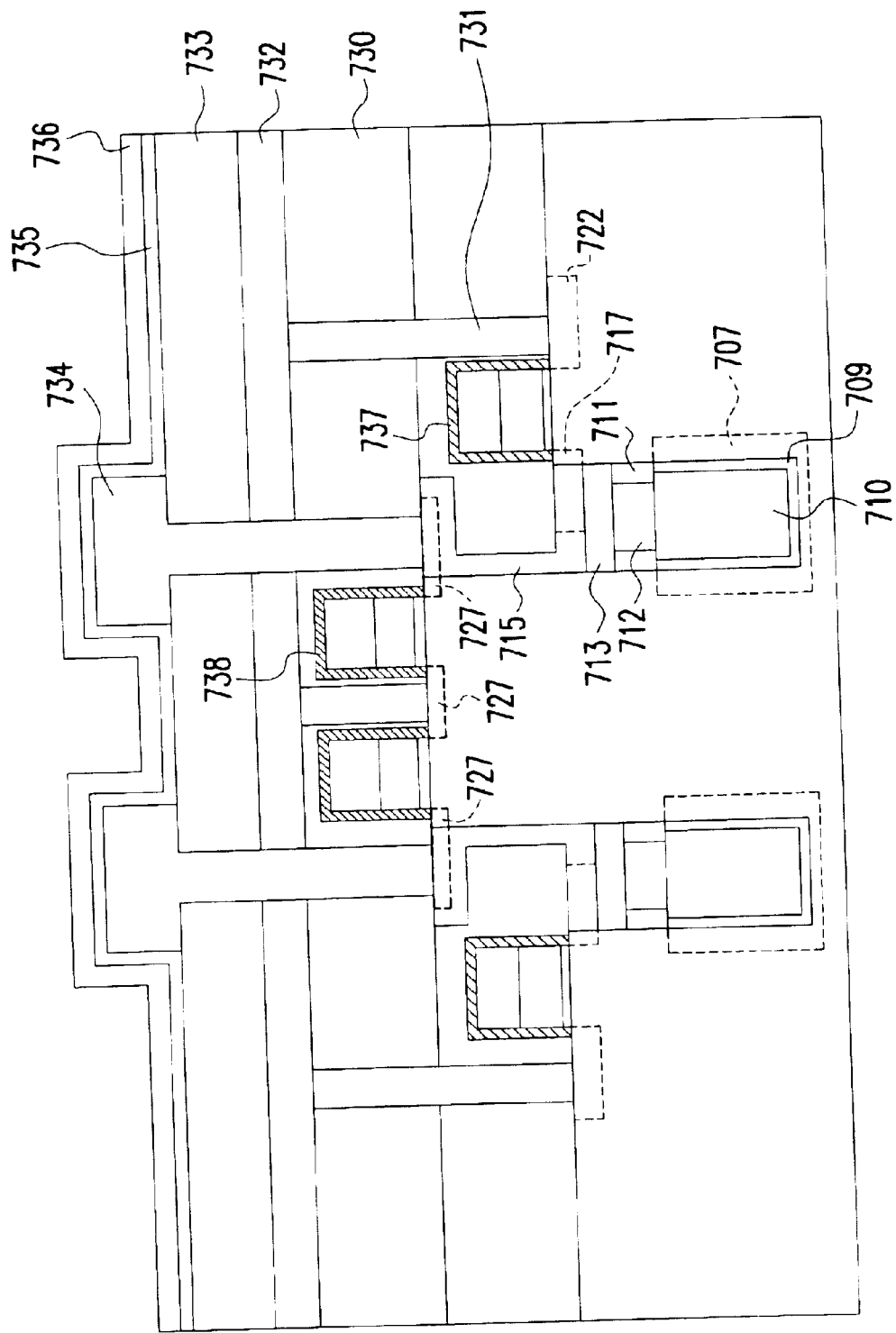

FIG. 8J is a cross-sectional view showing a synchronous dynamic random access memory according to one embodiment of this invention in detail. The trench capacitor structure comprises of a plurality of electrodes 710, 712 and 713, a doped region 707 and a capacitor dielectric layer 709. The electrodes 710, 712 and 713 are electrically connected to a doped region (source terminal) 717. The N-doped region 707 is in the substrate 700 around the electrode 710. The capacitor dielectric layer 709 is located between the electrode 710 and the N-doped region 707. The electrodes 710, 712 and 713 are made from polysilicon material, the doped regions 707, 717 are N-doped regions and the capacitor dielectric layer is made from silicon nitride material, for example.

The stacked capacitor structure comprises of a lower electrode 734, an upper electrode 736 and a capacitor dielectric layer 735. The lower electrode 734 is electrically connected to a doped region (source terminal) 727. The upper electrode 736 is located above the lower electrode 734 and the capacitor dielectric layer 735 is positioned between the upper electrode 736 and the lower electrode 734. Both the upper electrode 736 and the lower electrode 734 are made from polysilicon material and the capacitor dielectric layer 735 is made from silicon nitride, for example.

As shown in FIGS. 5 and 8J, the source/drain terminal 306 in FIG. 5 is identical to the N-doped region 717 in FIG. 8J, while the source/drain terminal 406 in FIG. 5 is identical to the doped region 727 in FIG. 8J.

Figure 6:
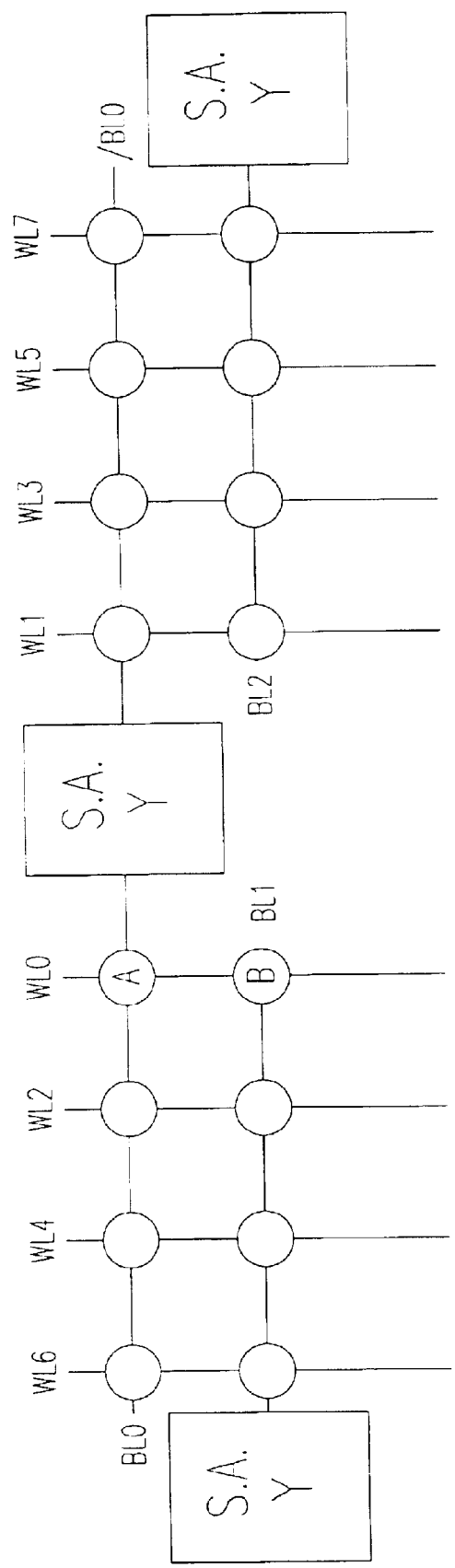
FIG. 6 shows a diagram showing the circuit design within the memory cell region of a synchronous dynamic random access memory according to one preferred embodiment of this invention.
Figure 7:
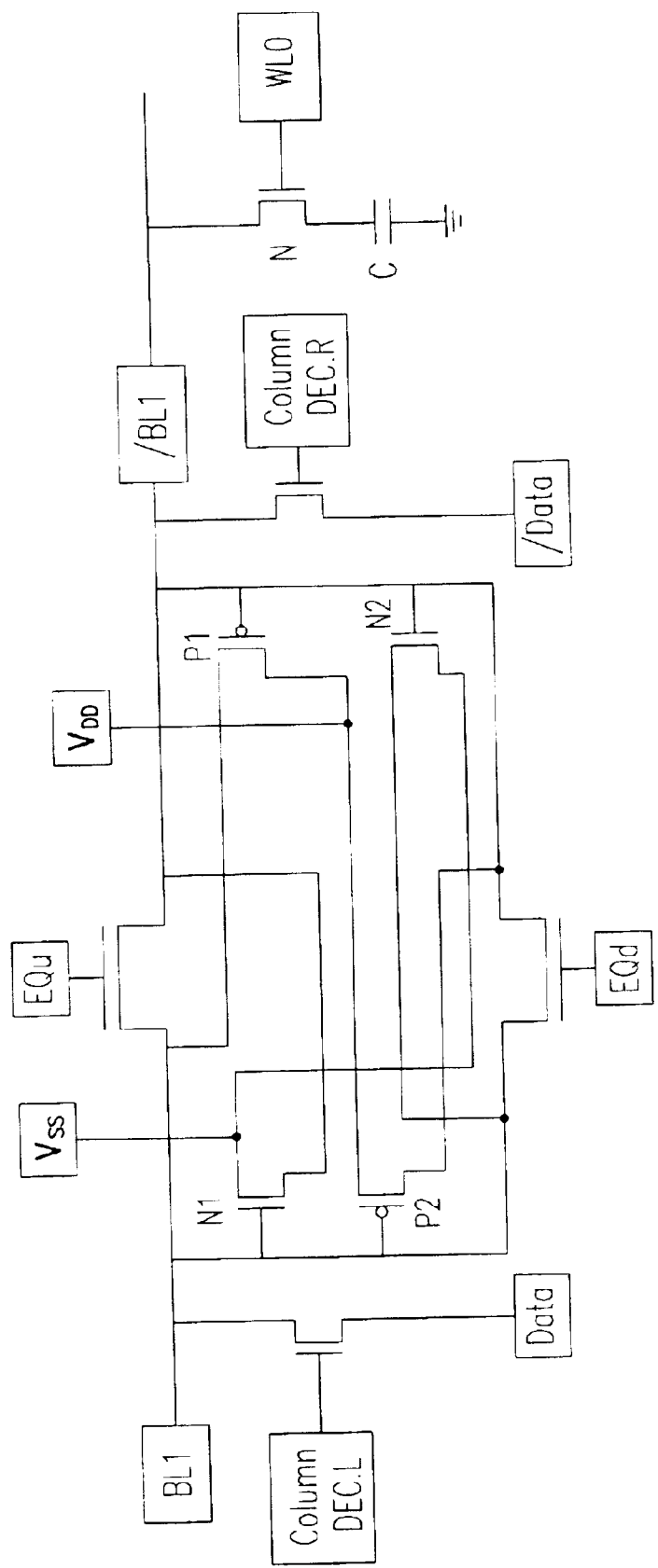
FIG. 7 shows a circuit diagram of a sense amplifier according to one preferred embodiment of this invention.

FIG. 6 is a diagram showing the circuit design within the memory cell region of a synchronous dynamic random access memory according to one preferred embodiment of this invention. FIG. 7 is a circuit diagram of a sense amplifier according to one preferred embodiment of this invention. As shown in FIG. 6, all the junction crossings between the bit line BL0 and the word lines WL0, WL2, WL4 and WL6 have a memory cell after integrating the stack capacitor and a trench capacitor together. Similarly, all the junction crossings between the bit line /BL0 and the word lines WL1, WL3, WL5 and WL7 have a memory cell. This effectively increases the utilization surface area in a wafer.

In this embodiment, the design of the sense amplifiers is slightly modified to accommodate the change in circuit layout. A sense amplifier Y is designed with both the bit line BL and the bit line /BL along the same Y-coordinate so that one sense amplifier Y is able to control them both. Furthermore, the even word lines WL0, WL2, WL4, WL6 and the odd word lines WL1, WL3, WL5, WL7 are located on each side of the sense amplifier Y.

For example, to read data from the memory cell at the junction between the word line WL0 and the bit line BL0 according to the memory cell circuit design in FIG. 6, a voltage signal is transmitted to the word line WL0. This will turn on the memory cell A at the crossing between the word line WL0 and the bit line BL0 as well as the memory cell B at the crossing between the word line WL0 and the bit line BL1. Because the sense amplifier Y along the bit line BL0 reads data only from the memory cell A, signal will not be confused. Hence, memory cells may fill up the entire wafer surface, when the sense amplifier Y according to this invention is applied to the memory cell circuit layout as shown in FIG. 6 leading to greater wafer surface area utilization.

Although one sense amplifier Y in FIG. 6 is able to control at most two bit lines, the two major limitations of a conventional sense amplifier X are overcome. As mentioned before, the problems of a conventional sense amplifier X are: (1) the opening of memory cell A and memory cell B causes errors in executing the refresh operation; and (2) signals from memory cell A and memory cell B diverts to BL1 and /BL1, when the word line WL0 switches open the memory cell A and the memory cell B at the same time, so that if the signals to the bit lines BL1 and /BL1 flows in the same direction (that is, both are at logic level '0' or '1'), the sense amplifier is prevented from operation, on the contrary, if the signals to the bit lines BL1 and /BL1 flows in opposite direction (one at logic level '0' and the other at logic level '1'), an user cannot decide whether the signal comes from memory cell A or the memory cell B.

The technique of using the sense amplifier Y to read data from a memory cell is described in the following with reference to FIG. 7. First, voltage equalizing transistors EQU and EQD equalize the voltage at the bit line BL1 and /BL1 and then set their voltage to a pre-defined voltage level VEQ. Thereafter, the transistors EQU and EQD are shut off and then the word line WL0 transmits a voltage signal to switch on a transistor N. Thereafter, the capacitor transmits a voltage signal $\Delta V$ (if the charge storage state of the capacitor C is '1') to the bit line /BL1 so that voltage at the bit line /BL1 reaches VEQ+$\Delta V$. Hence, the voltage applied to the gate of the P-type transistor P1 and the N-type transistor N2 will become VEQ+$\Delta V$, while the voltage applied to the gate of the P-type transistor P2 and the N-type transistor N1 is maintained at VEQ. In the meantime, the bias voltage applied to the transistor P1 and N2 is VEQ+$\Delta V$ and the bias voltage applied to the transistor P2 and N1 is VEQ. This will lead to the gradual shutdown of the low VT transistors N2 and P2 through the slow opening of the low VT transistors N2 and P2 due to the external voltage VDD and VSS. This process is continued until the transistors N2 and P2 are completely open and the transistors N1 and P1 are completely close. Thereafter, a voltage signal for reading data from this address is issued from a decoder (column decoder R, column decoder L). Thus, a voltage signal from the voltage source Vss is transmitted to the data line /Data via the transistor N2 and a voltage signal from the voltage source VDD is transmitted to the data line Data via the transistor P2. Through the signals on the data lines (Data and /Data), the data value (a data value of '1' or '0') stored inside the capacitor C can be determined.

Figure 3:
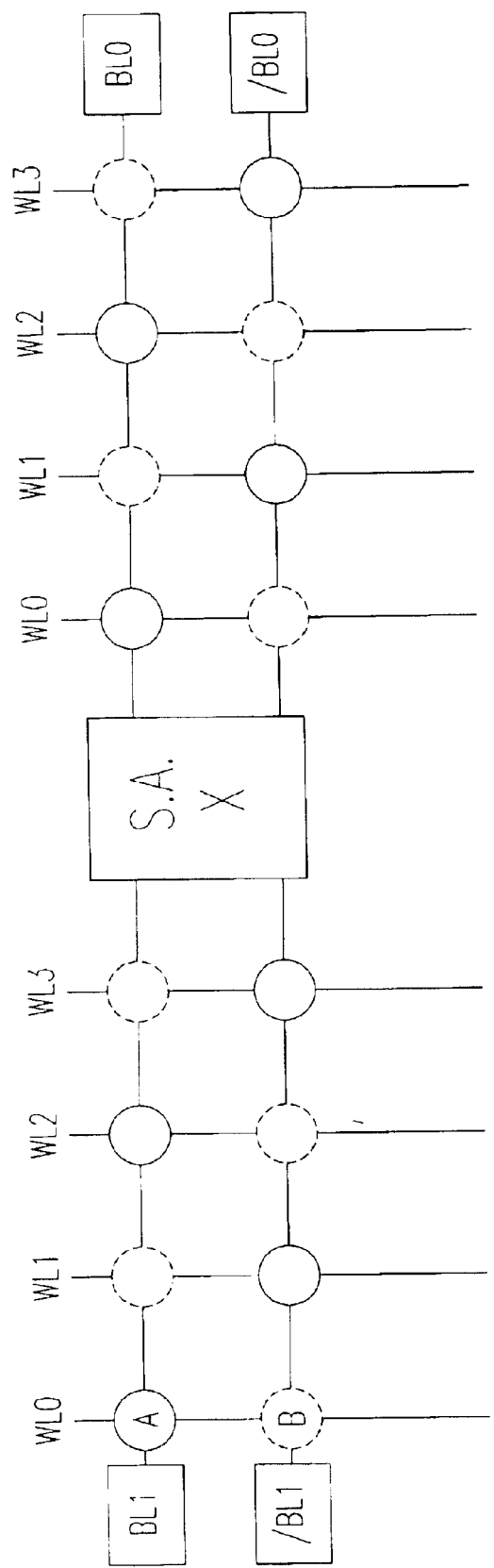
FIG. 3 shows a circuit diagram showing the memory cell design of a conventional synchronous dynamic random access memory.
Figure 4:
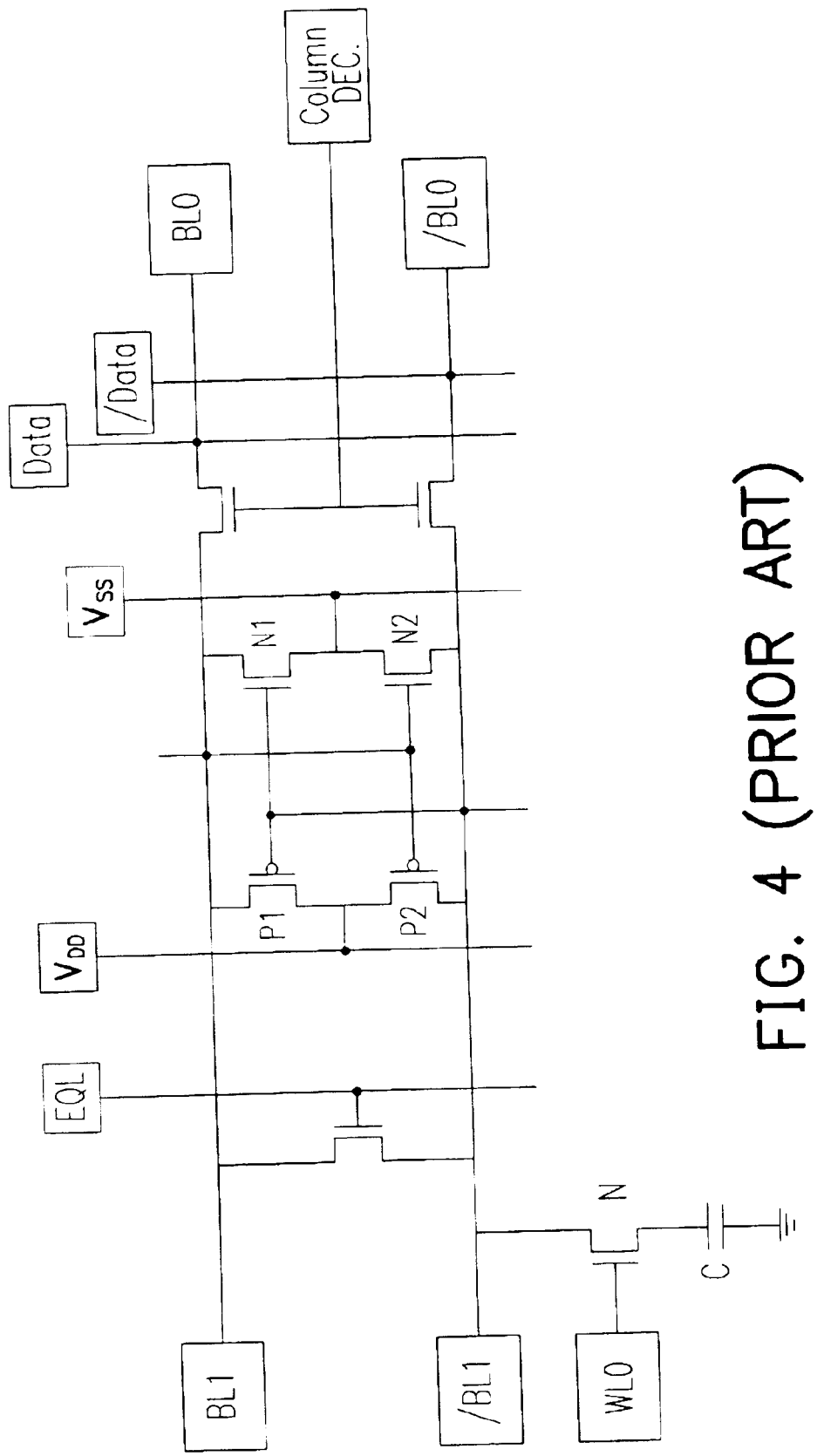
FIG. 4 shows the circuit diagram of a conventional sense amplifier.

The sense amplifier Y in this embodiment is capable of controlling two bit lines while a conventional sense amplifier X is capable of controlling four bit lines. Hence, the overall number of sense amplifiers Y used in this embodiment is twice that of the conventional sense amplifier X. However, this embodiment is able to utilize all the areas circled by dash lines in FIG. 3 so that memory capacity per unit area of wafer is twice that of a conventional one. Even with the use of twice as many sense amplifiers Y, overall memory capacity still increases considerably. In other words, total area occupied by the additional sense amplifiers Y is still considerably smaller than the total area enclosed by the circled dash line are in FIG. 3.

FIGS. 8A to 8J are schematic cross-sectional views showing the progression of steps for fabricating a synchronous dynamic random access memory according to another preferred embodiment of this invention. As shown in FIG. 8A, a substrate 700 is provided. Thereafter, a pad oxide layer 701, a dielectric layer 702 and a mask layer 703 are sequentially formed over the substrate 700. The substrate 700 is a silicon substrate and the dielectric layer 702 is a borosilicate glass layer, for example. Using the mask layer 703 as a mask, a portion of the dielectric layer 702, a portion of the pad oxide layer 701 and a definite thickness of the substrate 700 are removed to form trenches 704. The trenches 704 are formed, for example, by etching. An N-doped polysilicon layer 705 such as an arsenic doped polysilicon layer is formed at the bottom of the trenches 704. The N-doped polysilicon layer 705 is formed, for example, by depositing polysilicon over the substrate 700, forming a photoresist layer 706 over the polysilicon film and finally removing polysilicon material from regions exposed by the photoresist layer 706.

As shown in FIGS. 8A and 8B, a drive-in annealing process is conducted to form an N-doped region 707 in the substrate 700 at the bottom of the trenches 704. The arsenic doped polysilicon layer 705 and the photoresist layer 706 are removed and then a dielectric layer 708 is formed over the substrate 700 globally. The dielectric layer 708 can be a layer fabricated using silicon nitride ($SiN_x$) material.

As shown in FIG. 8C, a capacitor dielectric layer 709, an N-doped polysilicon layer 710, a wall oxide layer 711 and N-doped polysilicon channel layers 712, 713 are sequentially fabricated inside the trenches 704. The capacitor dielectric layer 709, the N-doped polysilicon layer 710, the wall oxide layer 711, the N-doped polysilicon layer 712 and the N-doped polysilicon layer 713 are fabricated by conducting photolithographic and etching processes. Before forming the capacitor dielectric layer 709, the mask layer 703 (as shown in FIG. 8B) is first removed. After fabricating the capacitor dielectric layer 709, the polysilicon layers including the N-doped polysilicon layer 710, the wall oxide layer 711, the N-doped polysilicon layer 712 and the N-doped polysilicon layer 713 are sequentially formed. Finally, the dielectric layer 702 (as shown in FIG. 8B) is removed to expose the underlying pad oxide layer 701.

In FIG. 8C, the N-doped region 707, the capacitor dielectric layer 709, the N-doped polysilicon layer 710, the wall oxide layer 711, the N-doped polysilicon channel layers 712 and 713 together constitute a trench capacitor. The N-doped polysilicon layer 710 is an electrode, the N-doped region 707 is equivalent to another electrode in the substrate 700, the wall oxide layer 711 and the capacitor dielectric layer 709 are insulating layers that isolate the two electrodes. The N-doped polysilicon channels 712 and 713 serve as conductive channels.

As shown in FIG. 8D, a mask oxide layer 714 is formed over pad oxide layer 701. Thereafter, a definite thickness of the substrate 700 outside the mask oxide layer 714 is removed. The mask oxide layer 714 is formed over the pad oxide layer 701 and a definite thickness of the exposed substrate 700 is removed by conducting photolithographic and etching processes.

As shown in FIG. 8E, an epitaxial layer 715 is formed over the substrate 700. Thereafter, a mask layer 716 is formed over the substrate 700 to pattern out an N-doped region 717 (shown in FIG. 8F). The epitaxial layer 715 is formed, for example, by forming a silicon epitaxial layer over the substrate 700 and removing the silicon epitaxial layer outside the trenches 704 through photolithographic and etching processes so that the upper surface of both the substrate 700 and the epitaxial layer 715 are uniform.

As shown in FIGS. 8E and 8F, an ion implant process is conducted to form an N-doped region 717 in the epitaxial layer 715 and the substrate 700 exposed by the mask layer 716. Thereafter, a dielectric layer 718, an N-doped polysilicon layer 719, a metal silicide layer 720 and a dielectric layer 721 are sequentially formed over the substrate 700. The dielectric layer 718 and the dielectric layer 721 are made from material such as silicon oxide or other dielectric material. The dielectric layer 721 has a planar upper surface. In addition, the N-doped polysilicon layer 719 and the metal silicide layer 720 may be fabricated using some other materials.

As shown in FIG. 8G, a portion of the N-doped polysilicon layer 719 and the metal silicide layer 720 are removed by conducting photolithographic and etching processes to form a dielectric layer 718a, a first gate layer 719a and a second gate layer 720a. Thereafter, the dielectric layer 721 is removed and a silicon nitride (SiNx) layer is formed over the wafer surface. Photolithographic and etching processes are conducted to form a gate insulation layer 737. The mask oxide layer 714 (as shown in FIG. 8F) is removed to expose the underlying pad oxide layer 701.

As shown in FIG. 8H, an N-doped region 722 is formed over the substrate 700 and then an insulating layer 723 is formed over the substrate 700. The dielectric layer 723 is polished to a suitable thickness by carrying out a chemical-mechanical polishing operation. The chemical-mechanical polishing operation also removes the pad oxide layer 701 and definite thickness of the epitaxial layer 715. Thereafter, a trench is formed in the dielectric layer 723 close to the epitaxial layer 715 and then an epitaxial 724 is formed inside the trench. A pad oxide layer 725 and a mask layer 726 are sequentially formed over the substrate 700 and the epitaxial layer 724. Next, an ion implant process is conducted using the mask layer 726 as a mask to form a doped region 727.

As shown in FIG. 8I, a gate dielectric layer 725a, a first gate layer 728 and a second gate layer 729 are formed over the substrate 700. Thereafter, an insulation layer 738 is formed to cover the gate dielectric layer 725a, the first gate layer 728 and the second gate layer 729. Plugs 731 are also formed passing through the insulation layer 730 and the insulation layer 723.

As shown in FIG. 8J, a bit line 732 and an insulation layer 733 are sequentially formed over the insulation layer 730. The bit line 732 and the N-doped region 722 are electrically connected through the plug 731. Finally, a stack capacitor comprising of an N-doped polysilicon layer 734, a capacitor dielectric layer 735 and an N-doped polysilicon layer 736 is formed such that the polysilicon layer 734 and the N-doped region 727 are electrically connected.

In summary, the synchronous dynamic random access memory structure according to this invention at least includes the following advantages:

1. Two detached source regions for connecting with a lower trench capacitor and an upper stack capacitor are fabricated. Hence, memory capacity per unit wafer area is increased.
2. The special sense amplifier Y design of this invention is able to make full utilization of all memory cells on the wafer instead of partial utilization of memory cell in a conventional sense amplifier X design.
3. Since both the trench capacitor structure and the stack capacitor structure use a common source region, the capacitance of each memory cell is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A synchronous dynamic random access memory (SDRAM) structure, comprising:

a substrate;

a plurality of first transistors over the substrate, wherein each first transistor has a first gate and a pair of first source/drain terminals;

a plurality of trench capacitor structures within the substrate, wherein the trench capacitor structures connect electrically with the respective first source/drain terminals;

an epitaxial layer over the substrate;

a plurality of second transistors over the epitaxial layer, wherein each second transistor has a second gate and a pair of second source/drain terminals;

a plurality of stacked capacitor structure over the epitaxial layer above the trench capacitor structure, wherein the stacked capacitor structures connect electrically with the respective second source/drain terminals; and a plurality of bit lines above the first transistors and the second transistors, wherein the bit lines connect electrically with the first source/drain terminals and the second source/drain terminals respectively.

2. The SDRAM structure of claim 1, wherein the substrate is a silicon substrate.

3. The SDRAM structure of claim 1, wherein the epitaxial layer is a silicon epitaxial layer.

4. The SDRAM structure of claim 1, wherein each first transistor comprises a first gate insulation layer between the substrate and the first gate.

5. The SDRAM structure of claim 1, wherein each first transistor comprises a second gate insulation layer between the substrate and the second gate.

6. The SDRAM structure of claim 1, wherein each trench capacitor structure comprises:
   an electrode electrically connected with the first source/drain terminal;
   an N-doped region in the substrate around the electrode; and
   a first capacitor dielectric layer between the electrode and the N-doped region.

7. The SDRAM structure of claim 6, wherein the electrode comprises in N-doped polysilicon layer.

8. The SDRAM structure of claim 6, wherein the first capacitor dielectric layer comprises a silicon nitride layer.

9. The SDRAM structure of claim 6, wherein each stacked capacitor structure comprises:
   a lower electrode electrically connected with the second source/drain terminal;
   an upper electrode above the lower electrode; and
   a second capacitor dielectric layer between the upper electrode and the lower electrode.

10. The SDRAM structure of claim 9, wherein the lower electrode comprises a polysilicon layer.

11. The SDRAM structure of claim 9, wherein the upper electrode comprises a polysilicon layer.

12. The SDRAM structure of claim 9, wherein the second capacitor dielectric layer comprises a silicon nitride layer.

* * * * *